United States Patent
Kim et al.

(10) Patent No.: US 11,050,033 B2
(45) Date of Patent: Jun. 29, 2021

(54) LIGHT-EMITTING FILM, PRODUCTION METHOD THEREOF, AND A LIGHT EMITTING DEVICE INCLUDING THE SAME

(71) Applicant: SAMSUNG ELECTRONICS CO., LTD., Suwon-si (KR)

(72) Inventors: Kwanghee Kim, Seoul (KR); Oul Cho, Suwon-si (KR); Chan Su Kim, Seoul (KR); Tae Hyung Kim, Seoul (KR); Eun Joo Jang, Suwon-si (KR); Moon Gyu Han, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/391,692

(22) Filed: Apr. 23, 2019

(65) Prior Publication Data

US 2019/0326533 A1 Oct. 24, 2019

(30) Foreign Application Priority Data

Apr. 24, 2018 (KR) .................. 10-2018-0047488

(51) Int. Cl.
*H01L 51/50* (2006.01)
*C09K 11/88* (2006.01)
(Continued)

(52) U.S. Cl.
CPC ........ *H01L 51/502* (2013.01); *C09K 11/0805* (2013.01); *C09K 11/0883* (2013.01);
(Continued)

(58) Field of Classification Search
CPC ..... C09K 11/565; C09K 11/88; C09K 11/881; C09K 11/883; C09K 11/621;
(Continued)

(56) References Cited

U.S. PATENT DOCUMENTS 5,372,839 A * 12/1994 Mikami ............... C09K 11/612
427/255.18
9,324,562 B1 * 4/2016 Luther ............ H01L 31/035218
(Continued)

FOREIGN PATENT DOCUMENTS

CN 104974759 A 10/2015
CN 106433634 A 2/2017
(Continued)

OTHER PUBLICATIONS

Machine translation, Jeong, Korean Pat. Pub. No. KR 101486533, translation date Jun. 27, 2020, Espacenet, all pages. (Year: 2020).*
(Continued)

*Primary Examiner* — Victoria K. Hall
(74) *Attorney, Agent, or Firm* — Cantor Colburn LLP

(57) ABSTRACT

A light emitting film including a plurality of quantum dots and an electronic device including the same. The plurality of quantum dots constitute at least a portion of a surface of the light emitting film, the plurality of quantum dots do not include cadmium, and the at least a portion of a surface of the light emitting film includes a metal halide bound to at least one quantum dot of the plurality of quantum dots.

20 Claims, 8 Drawing Sheets

(51) Int. Cl.

| | |
|---|---|
| *H01L 51/56* | (2006.01) |
| *C09K 11/08* | (2006.01) |
| *C09K 11/59* | (2006.01) |
| *C09K 11/56* | (2006.01) |
| *C09K 11/54* | (2006.01) |
| *C09K 11/62* | (2006.01) |
| *C09K 11/55* | (2006.01) |
| *C09K 11/74* | (2006.01) |
| *C09K 11/89* | (2006.01) |
| *C09K 11/66* | (2006.01) |
| *C09K 11/65* | (2006.01) |
| *C09K 11/61* | (2006.01) |
| *C09K 11/70* | (2006.01) |
| *C09K 11/64* | (2006.01) |

(52) U.S. Cl.
CPC .............. *C09K 11/54* (2013.01); *C09K 11/55* (2013.01); *C09K 11/56* (2013.01); *C09K 11/565* (2013.01); *C09K 11/59* (2013.01); *C09K 11/595* (2013.01); *C09K 11/61* (2013.01); *C09K 11/62* (2013.01); *C09K 11/64* (2013.01); *C09K 11/65* (2013.01); *C09K 11/66* (2013.01); *C09K 11/661* (2013.01); *C09K 11/70* (2013.01); *C09K 11/74* (2013.01); *C09K 11/883* (2013.01); *C09K 11/89* (2013.01); *C09K 11/892* (2013.01); *H01L 51/5056* (2013.01); *H01L 51/5072* (2013.01); *H01L 51/5092* (2013.01); *H01L 51/56* (2013.01); *H01L 2251/301* (2013.01)

(58) Field of Classification Search
CPC ... C09K 11/623; C09K 11/62; C09K 11/0883; C09K 11/54; C09K 11/615; C09K 11/613; C09K 11/626
See application file for complete search history.

(56) References Cited

U.S. PATENT DOCUMENTS

| | | | | |
|---|---|---|---|---|
| 9,517,936 | B2* | 12/2016 | Jeong | C01B 21/06 |
| 10,472,562 | B2* | 11/2019 | Lee | C09K 11/02 |
| 10,535,829 | B1* | 1/2020 | Kim | H01L 51/502 |
| 10,559,712 | B2* | 2/2020 | Park | C09K 11/025 |
| 10,711,193 | B2* | 7/2020 | Kim | C09K 11/025 |
| 10,717,927 | B2* | 7/2020 | Kim | C09K 11/72 |
| 10,808,174 | B2* | 10/2020 | Park | G02B 5/223 |
| 10,886,421 | B2* | 1/2021 | Ono | H01L 31/0324 |
| 10,978,658 | B2* | 4/2021 | Chung | H05B 33/14 |
| 2010/0284166 | A1* | 11/2010 | Lee | C09K 11/642 362/84 |
| 2013/0092885 | A1* | 4/2013 | Cho | H01L 29/0665 252/519.3 |
| 2016/0237344 | A1 | 8/2016 | Bakr et al. | |
| 2017/0012180 | A1* | 1/2017 | Baesjou | C09K 11/025 |
| 2017/0029693 | A1 | 2/2017 | Gruhlke et al. | |
| 2017/0174921 | A1* | 6/2017 | He | C09D 11/52 |
| 2017/0174984 | A1* | 6/2017 | Lee | C08K 3/32 |
| 2017/0179338 | A1* | 6/2017 | Park | H01L 33/30 |
| 2017/0271551 | A1* | 9/2017 | Kim | H01L 51/502 |
| 2018/0047217 | A1* | 2/2018 | Xu | H01L 51/5084 |
| 2018/0151817 | A1* | 5/2018 | Cho | C09K 11/703 |
| 2019/0112527 | A1* | 4/2019 | Moriyama | C09K 11/025 |
| 2019/0129302 | A1* | 5/2019 | Youn | G03F 7/2002 |
| 2020/0111933 | A1* | 4/2020 | Chung | H01L 51/0052 |
| 2020/0119296 | A1* | 4/2020 | Cho | C09K 11/025 |
| 2020/0239769 | A1* | 7/2020 | Jen-La Plante | C09K 11/56 |
| 2020/0308017 | A1* | 10/2020 | Cheng | C01G 23/053 |
| 2020/0357990 | A1* | 11/2020 | Kim | H01L 29/127 |
| 2021/0005834 | A1* | 1/2021 | Lee | H01L 51/5092 |
| 2021/0091327 | A1* | 3/2021 | Kim | H01L 51/502 |
| 2021/0104696 | A1* | 4/2021 | Park | H01L 51/0039 |
| 2021/0135138 | A1* | 5/2021 | Kim | C09K 11/883 |
| 2021/0135139 | A1* | 5/2021 | Lee | H01L 51/502 |

FOREIGN PATENT DOCUMENTS

| | | | | |
|---|---|---|---|---|
| CN | 106566529 | A | 4/2017 | |
| CN | 106701060 | A | 5/2017 | |
| CN | 107706315 | A | 2/2018 | |
| EP | 0252991 | B1 * | 4/1991 | .......... C09K 11/621 |
| JP | 2013089969 | A | 5/2013 | |
| KR | 101486533 | B1 | 2/2015 | |
| KR | 101719574 | B | 3/2017 | |
| WO | 2015117851 | A1 | 8/2015 | |
| WO | 2015117876 | A1 | 8/2015 | |
| WO | 2016186251 | A1 | 11/2016 | |

OTHER PUBLICATIONS

Machine translation, Jeong, Korean Pat. Pub. No. KR 2016-0147526, translation date: Jun. 27, 2020, Espacenet, all pages. (Year: 2020).*
Machine translation, Kang, WIPO Pat. Pub. No. WO 2016/186251, translation date: Jun. 27, 2020, Espacenet, all pages. (Year: 2020).*
Machine translation, Zhang, Chinese Pat. Pub. No. CN 106433634, translation date: Jun. 27, 2020, Espacenet, all pages. (Year: 2020).*
Machine translation, Cheng, Chinese Pat. Pub. No. CN 106566529, translation date: Jun. 27, 2020, Espacenet, all pages. (Year: 2020).*
Machine translation, Zhang, Chinese Pat. Pub. No. CN 107706315A, translation date: May 8, 2021, Espacenet, all pages (Year: 2021).*
Extended European Search Report dated Nov. 7, 2019, of the corresponding European Patent Application No. 19170579.7.
Xiyan Li et al., "Bright colloidal quantum dot light-emitting diodes enabled by efficient chlorination," Nature Photonics, Feb. 26, 2018, pp. 159-164, vol. 12.
Bartosz Trzaskowski et al., "A theoretical study of zinc(II) interactions with amino acid models and peptide fragments," JBIC Journal of Biological Inorganic Chemistry, Oct. 9, 2007, pp. 133-137, vol. 13, Issue 1.
Eunjoo Jang et al., "White-Light-Emitting Diodes with Quantum Dot Color Converters for Display Backlights," Advanced Materials, Jul. 21, 2010, pp. 3076-3080, vol. 22, Issue 28.
Seth Coe et al., "Electroluminescence from single monolayers of nanocrystals in molecular organic devices," Nature, Dec. 19, 2002, pp. 800-803, vol. 420.
Seth Coe-Sullivan et al., "Tuning the performance of hybrid organic/inorganic quantum dot light-emitting devices," Organic Electronics, Sep. 2003, pp. 123-130, vol. 4, Issues 2-3.
Tae-Ho Kim et al., "Full-colour quantum dot displays fabricated by transfer printing," Nature Photonics, Feb. 20, 2011, pp. 176-182, vol. 5.
Youhong Zeng et al., "Excited Hole Photochemistry of CdSe/CdS Quantum Dots," The Journal of Physical Chemistry, Jul. 13, 2016, pp. 17853-17862, vol. 120.
Office Action dated Apr. 6, 2021, of the corresponding Chinese Patent Application No. 201910332806.3.

* cited by examiner

LIGHT-EMITTING FILM, PRODUCTION METHOD THEREOF, AND A LIGHT EMITTING DEVICE INCLUDING THE SAME

CROSS-REFERENCE TO RELATED APPLICATION

This application claims priority to and the benefit of Korean Patent Applications No. 10-2018-0047488, filed in the Korean Intellectual Property Office on Apr. 24, 2018, and all the benefits accruing therefrom under 35 U.S.C. § 119, the content of which is incorporated herein in its entirety by reference.

BACKGROUND

1. Field

A light emitting film, a production method thereof, and a light emitting device including quantum dots are disclosed.

2. Description of the Related Art

Quantum dots (e.g., nano-sized semiconductor nanocrystals) may have different energy bandgaps by controlling the sizes and compositions of the quantum dots. Such quantum dots may emit light of various wavelengths.

Quantum dots may be used in various electronic devices including a display device.

SUMMARY

An embodiment is related to a light emitting film including a quantum dot that may exhibit enhanced properties.

An embodiment is related to a production method of the light emitting film.

An embodiment provides a light emitting device including the light emitting film.

In an embodiment, a light emitting film includes a plurality of quantum dots, wherein the plurality of quantum dots constitute at least a portion of a surface of the light emitting film, the plurality of quantum dots do not include cadmium and lead, the at least a portion of a surface of the light emitting film includes a metal halide that is bound to at least one quantum dot of the plurality of the quantum dots.

At least one quantum dot of the plurality of quantum dots may include a core including a first semiconductor nanocrystal and a shell disposed on the core, the shell including a second semiconductor nanocrystal.

The first semiconductor nanocrystal and the second semiconductor nanocrystal may be the same or different, and may include independently a Group II-VI compound, a Group III-V compound, a Group IV-VI compound, a Group IV element or compound, a Group compound, a Group I-II-IV-VI compound, or a combination thereof.

At least one quantum dot of the plurality of quantum dots (e.g., the first semiconductor nanocrystal) may include indium, zinc, or a combination thereof.

At least one quantum dot of the plurality of quantum dots (e.g., the first semiconductor nanocrystal) may include InP, InZnP, ZnSe, ZnTeSe, or a combination thereof.

An outermost layer of at least one quantum dot of the plurality of quantum dots may include zinc and sulfur.

The outermost layer may consist of zinc and sulfur.

The at least a portion of a surface of the light emitting film may not include an organic thiol compound.

The metal halide may include zinc, indium, magnesium, lithium, or a combination thereof.

The metal halide may include a metal included in an outermost layer of the quantum dots.

The metal halide may include a zinc chloride, a zinc bromide, a zinc iodide, an indium chloride, an indium bromide, an indium iodide, a gallium chloride, a gallium bromide, a gallium iodide, a magnesium chloride, a magnesium bromide, a magnesium iodide, a lithium chloride, a lithium bromide, a lithium iodide, or a combination thereof.

A thickness of the light emitting film may be greater than or equal to about 5 nanometers (nm).

A thickness of the light emitting film may be greater than or equal to about 15 nm.

The light emitting film may have a mole ratio of carbon with respect to a metal of an outermost layer of the light emitting film that is less than 1.5:1.

In an embodiment, a production method of the light emitting film includes:

disposing a film including the plurality of quantum dots; and treating the film with a solution including the metal halide in a polar (organic) solvent to bind the metal halide to at least one quantum dot of the plurality of quantum dots.

The method may further include washing the treated film with a polar solvent that does not include a metal halide.

The method may further include heating the washed film to a temperature of greater than or equal to about 60° C.

The polar solvent may include a C1 to C10 alcohol.

In an embodiment, a light emitting device includes a first electrode and a second electrode facing each other, and the aforementioned light emitting film.

The light emitting device may further include a hole auxiliary layer including a hole injection layer (HIL), a hole transport layer (HTL), or a combination thereof between the first electrode and the light emitting layer.

The light emitting device may further include an electron auxiliary layer including an electron injection layer (EIL), an electron transport layer (ETL), or a combination thereof between the second electrode and the light emitting layer.

An embodiment provides a display device including the light emitting device.

When being applied to a light emitting device (e.g., an electroluminescent device), the light emitting film of an embodiment may accomplish improvements in the properties (e.g., life time, brightness, a charge property, a driving voltage, and the like) of the device.

BRIEF DESCRIPTION OF THE DRAWINGS

These and/or other aspects will become apparent and more readily appreciated from the following description of the embodiments, taken in conjunction with the accompanying drawings in which.

Figure 7:
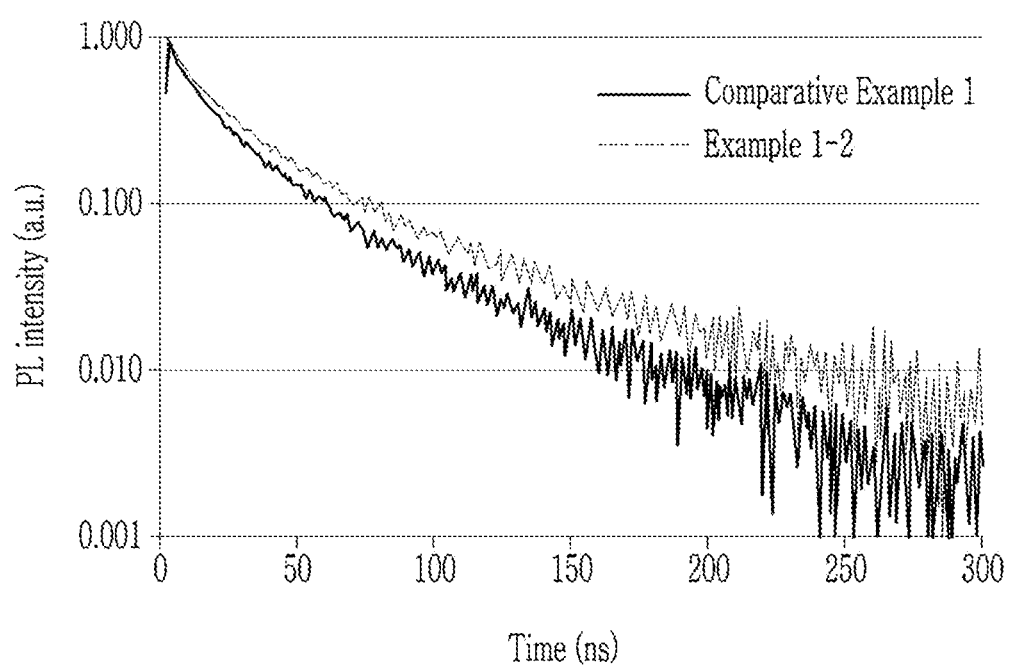

for the light emitting films prepared in Reference Example 1, Example 1, and Example 2;

FIG. 7 is a graph of photoluminescent (PL) intensity (a.u.) versus time (nanoseconds, ns) showing time resolved spectroscopic analysis results of the light emitting films prepared in the Examples and Comparative Examples.

Figure 8:
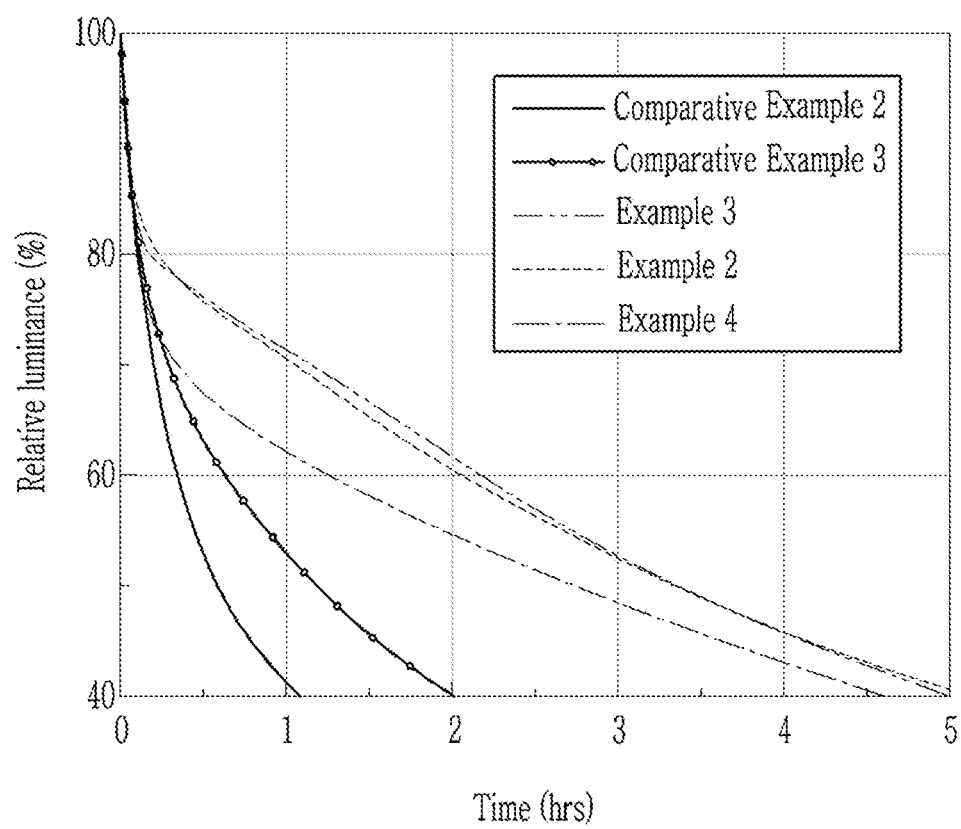

FIG. 8 is a graph of relative luminance (percent, %) versus time (hours, hrs) showing the life time of the devices prepared in the Examples and Comparative Examples.

DETAILED DESCRIPTION

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In order to clearly illustrate the embodiments in the drawings, some portions not really relevant to the explanation may be omitted.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" refers to the case where in a compound or a group or a moiety, hydrogen is substituted with a substituent including a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—O(=NH)NH$_2$), a hydrazino group (—NHNH$_2$), a hydrazono group (=N(NH$_2$), an aldehyde group (—O(=O)H), a carbamoyl group (—C(O)NH$_2$), a thiol group (—SH), an ester group (—O(=O)OR, wherein R is a C1 to C6 alkyl group or a C6 to C12 aryl group), a carboxylic acid group or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the term "Group" in the term Group III, Group II, and the like refers to a group of Periodic Table.

As used herein, when a definition is not otherwise provided, "Group I" refers to Group IA and Group IB, and examples may include Li, Na, K, Rb, and Cs, but are not limited thereto.

As used herein, when a definition is not otherwise provided, "Group II" refers to Group IIA and Group IIB, and examples of Group II metal may be Zn, Hg, and Mg, but are not limited thereto.

As used herein, when a definition is not otherwise provided, "Group III" refers to Group IIIA and Group IIIB, and examples of Group III metal may be Al, In, Ga, and Tl, but are not limited thereto.

As used herein, when a definition is not otherwise provided, "Group IV" refers to Group IVA and Group IVB, and examples of a Group IV metal may be Si, Ge, and Sn, but are not limited thereto. As used herein, the term "metal" may include a semi-metal such as Si.

As used herein, when a definition is not otherwise provided, "Group V" refers to Group VA, and examples may include N, P, As, Sb, and Bi, but are not limited thereto.

As used herein, when a definition is not otherwise provided, "Group VI" refers to Group VIA, and examples may include S, Se, and Te, but are not limited thereto.

A quantum dot (e.g., a semiconductor nanocrystal particle) may have a theoretical quantum yield of 100% and may emit light of relatively high color purity (e.g., having a full width half maximum of less than or equal to about 40 nanometers (nm)). The quantum dot may contribute to achieving enhanced luminous efficiency and improved color reproducibility when used as a luminous material.

An electroluminescent display device is a type of a display device that can be operated without an external light source.

An electroluminescent display device includes a light emitting device including an electroluminescent material, wherein an electron and a hole injected from two electrodes respectively combine with each other at a light emitting layer to form an exciton, emitting energy in a form of light.

Figure 1:
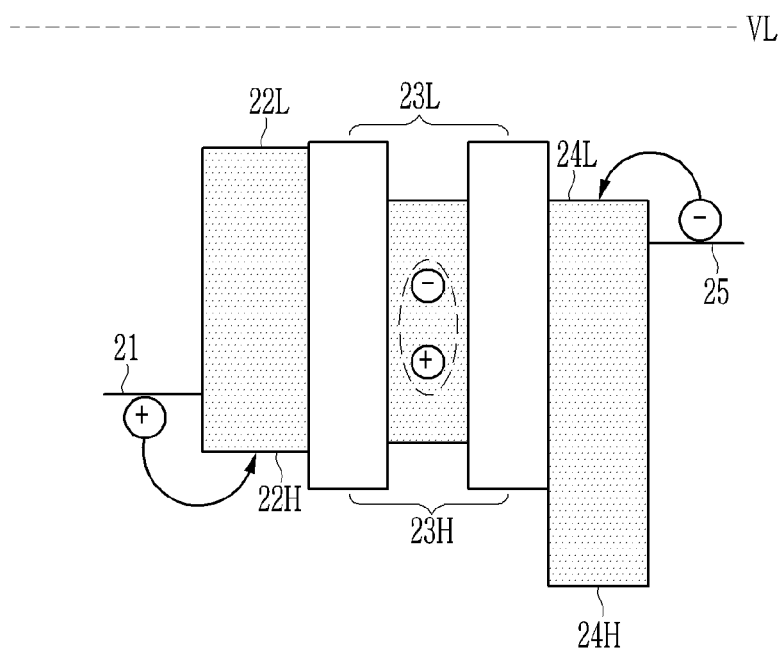
FIG. 1 is a band alignment diagram of each layer in an embodiment of a light emitting device.

In an embodiment, an energy level of the light emitting device including the quantum dot is shown in FIG. 1.

In FIG. 1, an energy level (electron volt, eV) is shown with reference to a vacuum level (VL), and the term "work function" means energy to migrate a charge at a Fermi level to a vacuum level (VL). The HOMO (highest occupied molecular orbital) energy level of each layer is represented as "H" and the LUMO (lowest unoccupied molecular orbital) energy level is denoted as "L."

A light emitting device of FIG. 1 includes a first electrode 21, a hole injection layer and a hole transporting layer 22, a emissive layer 23, an electron transport layer 24, and a second electrode 25.

With reference to FIG. 1, a hole is injected from the first electrode 21 (e.g., indium tin oxide (ITO) first electrode), passes the highest occupied molecular orbital (HOMO) 22H of the hole transport layer (HTL), and reaches the HOMO 23H of the emissive layer 23, and the electron is injected from the second electrode 25 (e.g., Ag second electrode), passes the LUMO 24L of the electron transport layer (ETL) and reaches the LUMO 23L of the emissive layer 23. The hole and the electron are recombined at the emissive layer (e.g., quantum dot (QD) emissive layer) and emit light. The HTL further includes a LUMO 22L and the ETL further includes a HOMO 24H.

A device (e.g., an electroluminescent device) including a quantum dot based luminescent layer is expected to exhibit greater luminous efficiency and narrower luminous spectrum than an organic light emitting diode. Charges injected into the light emitting device form an exciton (e.g., a pair of an electron and a hole) in a quantum dot and emit light. The quantum dot includes an organic ligand on, e.g., bound to, a surface thereof. The organic ligand provides a dispersion stability in an organic solvent during a production process of a device and may contribute to a decrease in surface defects of the quantum dots. In order to prevent precipitation in a solution, the quantum dots may include an organic ligand having a relatively long chain (e.g., a C12 or greater organic group) in a sufficient amount. However, such an organic ligand is electrically insulative and thus it may act as a barrier to the electrons and the holes, adversely affecting the luminous properties of the device. In addition, upon operation of the device, the organic ligand may detach from the quantum dot, and a non-radiative transition and a decrease in luminous properties may result. In a light emitting diode (LED) device involving a charge injection, imbalance between the electron and the hole may occur, resulting in a quantum dot charging phenomenon. Detachment of the organic ligand from the charged quantum dot may cause a surface defect of the quantum dot, non-radiative properties of the quantum dot may be increased, and a life time of the device may be decreased.

In an embodiment, a light emitting film includes a plurality of quantum dots that do not include cadmium and lead, wherein the plurality of quantum dots constitute at least a portion (or entire, e.g., an entirety) of a surface of the light emitting film, and the at least a portion (or entire, e.g., an entirety) of a surface of the light emitting film include a metal halide that is linked (e.g., bound) to the quantum dots. In an embodiment, the plurality of quantum dots do not include a toxic heavy metal (including cadmium and lead). The light emitting film of an embodiment may contribute to improvements in luminous properties and an increase of life time for an electroluminescent device. The quantum dot (hereinafter, also referred to as a semiconductor nanocrystal particle) may have a core-shell structure that includes a core including a first semiconductor nanocrystal and a shell disposed on the core and including a second semiconductor nanocrystal. The second semiconductor nanocrystal may have a composition that is different from the first semiconductor nanocrystal. The quantum dot of an embodiment does not include an organic ammonium salt. The term "semiconductor nanocrystal" may refer to a nanocrystal compound that does not include an organic ligand.

The semiconductor nanocrystal (e.g., the first semiconductor nanocrystal, the second semiconductor nanocrystal, or a combination thereof) may include a Group II-VI compound, a Group III-V compound, a Group IV-VI compound, a Group IV element or compound, a Group compound, a Group I-II-IV-VI compound, or a combination thereof.

The Group II-VI compound may include:

a binary element compound including ZnS, ZnSe, ZnTe, ZnO, HgS, HgSe, HgTe, MgSe, MgS, or a combination thereof;

a ternary element compound including ZnSeS, ZnSeTe, ZnSTe, HgSeS, HgSeTe, HgSTe, HgZnS, HgZnSe, HgZnTe, MgZnSe, MgZnS, or a combination thereof;

a quaternary element compound including ZnSeSTe, HgZnTeS, HgZnSeS, HgZnSeTe, HgZnSTe, or a combination thereof; or a combination thereof.

The Group II-VI compound may further include a Group III metal.

The Group III-V compound may include:

a binary element compound including GaN, GaP, GaAs, GaSb, AlN, AlP, AlAs, AlSb, InN, InP, InAs, InSb, or a combination thereof;

a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof;

a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof.

The Group III-V compound may further include a Group II metal (e.g., InZnP).

The Group IV-VI compound may include:

a binary element compound including SnS, SnSe, SnTe, or a combination thereof;

a ternary element compound including SnSeS, SnSeTe, SnSTe, or a combination thereof;

a quaternary element compound including SnSSeTe; or a combination thereof.

Examples of the Group compound may include $CuInSe_2$, $CuInS_2$, CuInGaSe, and CuInGaS, but are not limited thereto.

Examples of the Group I-II-IV-VI compound may include CuZnSnSe and CuZnSnS, but are not limited thereto.

The Group IV element or compound may include:

a single-element including Si, Ge, or a combination thereof;

a binary element compound including SiC, SiGe, or a combination thereof; or a combination thereof.

The first semiconductor nanocrystal may include indium, zinc, or a combination thereof. The first semiconductor nanocrystal may include InP, InZnP, ZnSe, ZnSeTe, or a combination thereof. The quantum dot may include zinc and sulfur in an outermost layer of the shell.

The binary element compound, the ternary element compound, the quaternary element compound, or the combination thereof may be respectively included in the particle at a uniform concentration or at partially different concentrations. The quantum dot may include a core including a first semiconductor nanocrystal and a shell disposed on at least a portion (or the entirety) of a surface of the core and including a second semiconductor nanocrystal having a different composition from that of the first semiconductor nanocrystal. At the interface between the core and the shell, an alloyed interlayer may be present or may not be present. The alloyed layer may include a homogeneous alloy. The alloyed layer may have a concentration gradient. In the gradient alloy, the concentration of an element of the shell radially changes (e.g., decreases or increases toward the core). In addition, the shell may include a multi-layered shell having at least two layers wherein adjacent two layers have different compositions from each other. In the multi-layered shell, each layer may have a single composition. In the multi-layered shell, each layer may independently have an alloy. In the multi-layered shell, each layer may have a concentration gradient that radially changes in light of a composition of a semiconductor nanocrystal.

In the quantum dot having a core-shell structure, the materials of the shell may have a bandgap energy that is larger than that of the core, but it is not limited thereto. The materials of the shell may have a bandgap energy that is smaller than that of the core. In the case of the multi-layered shell, the energy bandgap of the outermost layer material of the shell may be greater than those of the core and the inner layer material of the shell (a layer that is closer to the core). In the case of the multi-layered shell, a semiconductor nanocrystal of each layer is selected to have an appropriate bandgap energy, thereby effectively exhibiting a quantum confinement effect.

The light emitting wavelength of the quantum dot may be selected appropriately. The photoluminescent peak wavelength of the semiconductor nanocrystal may be present in a range from an ultraviolet region to a near infrared region. For example, the maximum peak wavelength of the semiconductor nanocrystal may be present within a range from about 420 nm to about 750 nm (e.g., about 460 nm to about 700 nm). In case of a green light emitting quantum dot, the maximum photoluminescent peak wavelength may be present in a range from about 500 nm (e.g., about 510 nm) to about 550 nm. In case of a red light emitting quantum dot, the maximum photoluminescent peak wavelength may be present in a range from about 600 nm (e.g., 610 nm) to about 650 nm. In case of a blue light emitting quantum dot, the maximum photoluminescent peak wavelength may be present in a range from about 440 nm (e.g., about 450 nm) to about 480 nm (e.g., about 470 nm).

The quantum dot may have a relatively narrow full width at half maximum (FWHM). In an embodiment, the FWHM of the quantum dot may be less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, or less than or equal to about 35 nm. The quantum dot may have a quantum yield (or a quantum efficiency) of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or even about 100%.

The quantum dot may have a size (e.g., a diameter of a particle, or in the case of a non-spherically shaped particle, a diameter calculated from a two dimensional area determined in an electron microscopic analysis) of about 1 nm to about 100 nm. In an embodiment, the semiconductor nanocrystal may have a particle size of about 1 nm to about 50 nm, for example, from 2 nm (or from 3 nm) to 35 nm. In an embodiment, the semiconductor nanocrystal have a size of greater than or equal to about 1 nm, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, or greater than or equal to about 10 nm. In an embodiment, the quantum dot have a size of less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, or less than or equal to about 15 nm.

The quantum dot may have a shape that is not particularly limited. For example, the quantum dot may have a spherical shape, a pyramidal shape, a multi-armed shape, or a cubic shape. The quantum dot may be a nanotube, a nanowire, a nanofiber, a nanosheet, a nanoplate, or a combination thereof.

The quantum dot may be commercially available or may be synthesized by any suitable method. For example, several nano-sized quantum dots may be synthesized by a wet chemical process. In the wet chemical process, precursors react in an organic solvent to grow nanocrystal particles, and the organic solvent or a ligand compound may coordinate (or be bound) to the surface of the semiconductor nanocrystal, thereby controlling the growth of the semiconductor nanocrystal.

The organic solvent and the ligand compound may be selected appropriately. For example, the organic solvent may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with at least one (e.g., 1, 2, or 3) C6 to C22 alkyl group, a phosphine oxide (e.g., trioctylphosphine oxide) substituted with at least one (e.g., 1, 2, or 3) C6 to C22 alkyl group, a C12 to C22 aromatic ether such as a phenyl ether or a benzyl ether, or a combination thereof.

The ligand compound may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, RHPOOH, $R_2POOH$, or a combination thereof, wherein, each R is the same or different and is independently a substituted or unsubstituted C1 to C40 aliphatic hydrocarbon group, a substituted or unsubstituted C6 to C40 aromatic hydrocarbon group, or a combination thereof. One or more ligands may be used.

The quantum dot as prepared may be recovered by pouring an excess amount of a non-solvent to a reaction solution including the quantum dot in order to remove an extra, e.g., residual, amount of an organic substance that is not coordinated to a surface of the semiconductor nanocrystal and centrifuging the resulting mixture. Examples of the non-solvent may include acetone, ethanol, methanol, and the like, but are not limited thereto.

The quantum dots as recovered include an organic substance (e.g., an organic ligand) on a surface thereof and the amount of the organic substance coordinating (e.g., bound) to the surface of the semiconductor nanocrystal may be greater than or equal to about 20% by weight and less than or equal to about 35% by weight, with respect to a total weight of the quantum dot. The presence of the aforementioned amount of the organic substance may improve dispersability of the quantum dot. However, the foregoing amount of the organic substance may act as a barrier against the injection of the electrons and the holes, leading to a considerable decrease in the luminous efficiency.

The light emitting film of an embodiment includes a plurality of quantum dots, which constitute at least a portion of a surface of the light emitting film. The at least a portion of the surface of the light emitting film includes a metal halide that linked (e.g., bound) to (e.g., surfaces of) the plurality of the quantum dots. The metal halide may bind, e.g., relatively strongly, to the quantum dots of the surface of the light emitting film and thereby may passivated the quantum dots instead of (e.g., in substitution for) the organic ligand (e.g., oleic acid) present on the surface of the quantum dot. Without wishing to be bound by any theory, it is believed that in the light emitting film of an embodiment, the quantum dots exposed on a surface of the film include the metal halide that is bound, e.g., relatively strongly, to the surfaces of the quantum dots instead of at least a portion of the organic ligand. Instead of the organic ligand acting as an insulator, the metal halide may provide an improved passivation with the quantum dot light emitting film and may also enhance the charge injection to the light emitting film. The metal halide may also decrease an operating voltage of a device.

The metal halide may include zinc, indium, gallium, magnesium, lithium, or a combination thereof, in a form of a halide, a bromide, an iodide, or a fluoride, or a combination thereof. The metal included in the metal halide may be the same as a metal included in the outermost layer of the quantum dot. In an embodiment, the outermost layer of the quantum dot may include zinc and the metal halide may include a zinc halide. In an embodiment, the metal halide may include a zinc chloride, a zinc bromide, a zinc iodide, an indium chloride, an indium bromide, an indium iodide, a gallium chloride, a gallium bromide, a gallium iodide, a magnesium chloride, a magnesium bromide, a magnesium iodide, a lithium chloride, a lithium bromide, a lithium iodide, or a combination thereof.

A thickness of the light emitting film may be greater than or equal to about 5 nm, for example, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 25 nm, greater than or equal to about 30 nm, or greater than or equal to about 35 nm. The light emitting film may include at least two (e.g., at least three, at least four, or greater) monolayers of the quantum dots. A thickness of the light emitting film may be less than or equal to about 100 nm, for example, 90 nm, less than or equal to about 80 nm, less than or equal to about 70 nm, less than or equal to about 60 nm, less than or equal to about 50 nm, or less than or equal to about 40 nm. The light emitting layer of an embodiment may have improved charge injection properties, and a thickness of the light emitting layer may be relatively increased.

At least a portion (or an entire) of the surface of the light emitting film does not include an organic thiol compound (e.g., linked or bound to the plurality of the quantum dots). The organic thiol compound may include a monothiol compound, a cis type dithiol compound, or a combination thereof.

The plurality of the quantum dots may further include a carboxylic acid compound on a surface thereof. The carboxylic acid compound may be a native organic ligand that is originally present on a surface of the quantum dot. The carboxylic acid compound may include a C6 or greater (e.g., C8 or greater, C12 or greater, C15 or greater, C16 or greater, or C18 or greater) and C30 or less aliphatic carboxylic acid. The quantum dots may include a limited, e.g., relatively small, amount of a ligand derived from a compound represented by RCOOH (wherein R is a C12 or greater alkyl, or a C12 or greater alkenyl).

In an embodiment, when being measured by an X-ray photoelectron spectroscopic analysis with respect to the light emitting film, the molar amount of the carbon with respect to the metal included in the outermost layer of the quantum dot (e.g., zinc) may be less than or equal to about 1.6:1, for example, less than or equal to about 1.5:1, less than or equal to about 1.4:1, less than or equal to about 1.3:1, or less than or equal to about 1.2:1. The molar amount ratio of the carbon with respect to the metal included in the outermost layer of the quantum dot (e.g., zinc) may be greater than or equal to about 0.5:1, greater than or equal to about 0.6:1, greater than or equal to about 0.7:1, greater than or equal to about 0.8:1, or greater than or equal to about 0.9:1.

The light emitting film may be disposed on a substrate. The light emitting film may be in contact with the substrate. The substrate may further include a hole auxiliary layer (e.g., a hole injection layer, a hole transport layer, or a combination thereof). The substrate may be a translucent or a transparent substrate In an embodiment, a production method of the light emitting film includes:

disposing a film including a plurality of quantum dots (hereinafter, a quantum dot film) in such a manner that the plurality of quantum dots constitute at least a portion of a surface of the film; and treating the film with a solution including a metal halide in a polar (organic) solvent to link (e.g., bind) the metal halide to at least one quantum dot of the plurality of quantum dots.

Details of the quantum dot, the metal halide, and the substrate are the same as set forth above.

Prior to the treating with the solution, the plurality of quantum dots may include a native ligand. The native ligand may include the aforementioned carboxylic acid compound.

A manner of disposing the quantum dot film on a substrate is not particularly limited and may be selected appropriately. The manner of disposing the film may include a spin coating, a contact printing, or a combination thereof. A detailed manner of disposing the film on a substrate may be selected appropriately. The method may further include washing the treated film at least one time with a polar solvent that does not include a metal halide. During the washing, the metal halide not linked (e.g., bound) to the quantum dot may be removed. The disposed (and optionally washed) quantum dot film may be heat-treated at a temperature of greater than or equal to about 50° C. (for example, of greater than or equal to about 60° C., greater than or equal to about 70° C., greater than or equal to about 75° C., or higher) and less than or equal to about 150° C., less than or equal to about 120° C., or less than or equal to about 100° C.) for a time period of greater than or equal to about one minute, 2 minutes or greater, 3 minutes or greater, 4 minutes or greater, 5 minutes or greater, 10 minutes or greater, 15 minutes or greater, 20 minutes or greater and less than or equal to about one hour.

The polar solvent may include an alcohol having a C1 to C10 linear or branched hydrocarbon group or a combination thereof. In an embodiment, the polar solvent may include methanol, ethanol, propanol, isopropanol, butanol, pentanol, hexanol, heptanol, or a combination thereof.

The treating may include contacting the solution with the film. The contacting may include a spraying, an immersion, or a combination thereof, but is not limited thereto.

In an embodiment, a light emitting device includes the aforementioned light emitting film. In the light emitting device, the light emitting film may be disposed between two electrodes (e.g., a first electrode and a second electrode or an anode and a cathode) facing each other.

Figure 2:
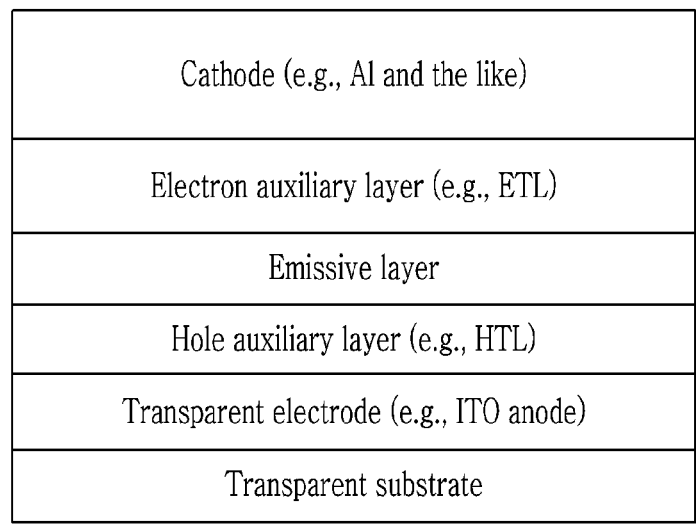
FIG. 2 is a cross-sectional view of an embodiment of a light emitting device.

In an embodiment, at least one of the anode and the cathode (e.g., disposed on a transparent substrate) may include a metal oxide transparent electrode (e.g., ITO electrode). At least one of the anode and the cathode (e.g., disposed on a transparent substrate) may include a metal (Mg, Al, etc.) having a predetermined (e.g., relatively low) work function. For example, poly(3,4-ethylenedioxythiophene):poly(styrenesulfonate (PEDOT:PSS), a p-type metal oxide, poly(9,9-dioctyl-fluorene-co-N-(4-butylphenyl)-diphenylamine) (TFB), poly(N-vinylcarbazole) (PVK), or a combination thereof may be disposed between the transparent electrode and the emission layer, as a hole injection layer, a hole transport layer HTL, or a combination thereof, respectively. An electron auxiliary layer (e.g., electron transport layer) may be disposed between the light emitting film and the cathode (see FIG. 2).

Figure 3:
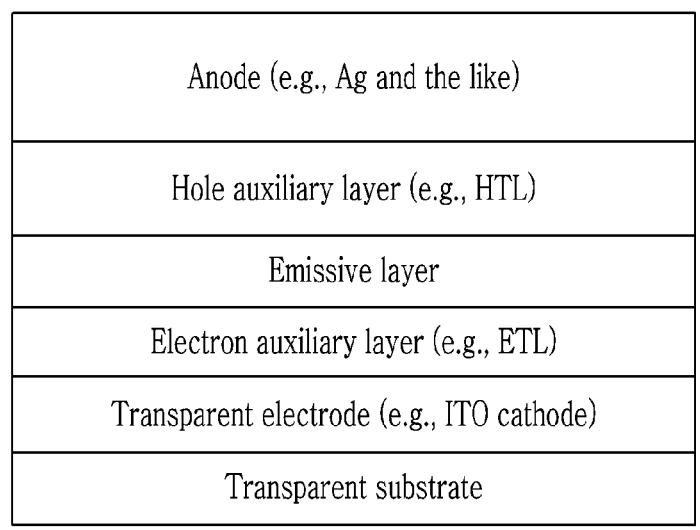
FIG. 3 is a cross-sectional view of an embodiment of a light emitting device.

A device according to an embodiment may have an inverted structure. Herein, a cathode disposed on a transparent substrate may include a metal oxide transparent electrode (e.g., ITO, fluorine doped tin oxide (FTO)) and an anode facing the cathode may include a metal (Au, Ag, etc.) of a predetermined (e.g., relatively high) work function. For example, an n-type metal oxide (ZnO) may be disposed between the transparent electrode and the emissive layer as an electron auxiliary layer (e.g., an electron transport layer). $MoO_3$ or another p-type metal oxide may be disposed between the metal anode and the quantum dot emission layer as a hole auxiliary layer (e.g., a hole injection layer) The TFB, the PVK, or a combination thereof may be disposed between the transparent electrode and the emission layer as a hole transport layer (HTL). (see FIG. 3).

Figure 4:
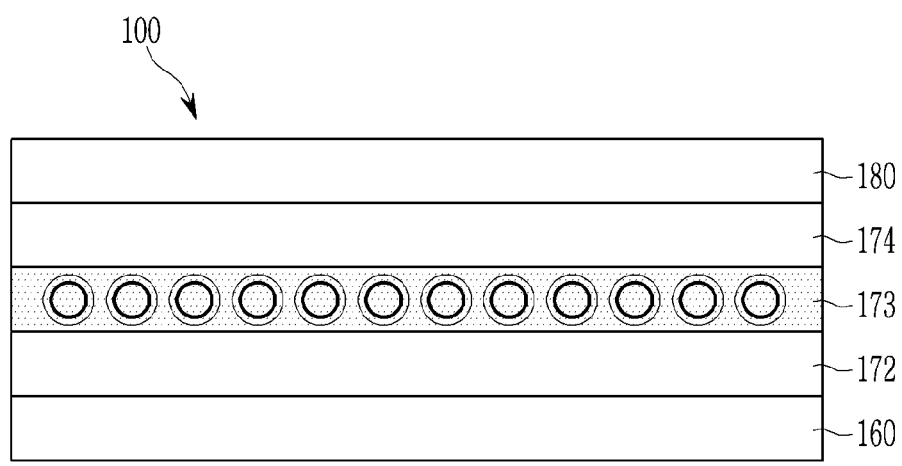
FIG. 4 is a cross-sectional view of an embodiment of a light emitting device.

Hereinafter, explanation regarding the light emitting device of an embodiment and a display device including the same will be provided with reference to FIG. 4 and FIG. 5. FIG. 4 is a cross-sectional view of a light emitting device according to an embodiment, and FIG. 5 is a cross-sectional view of a display device according to an embodiment.

Figure 5:
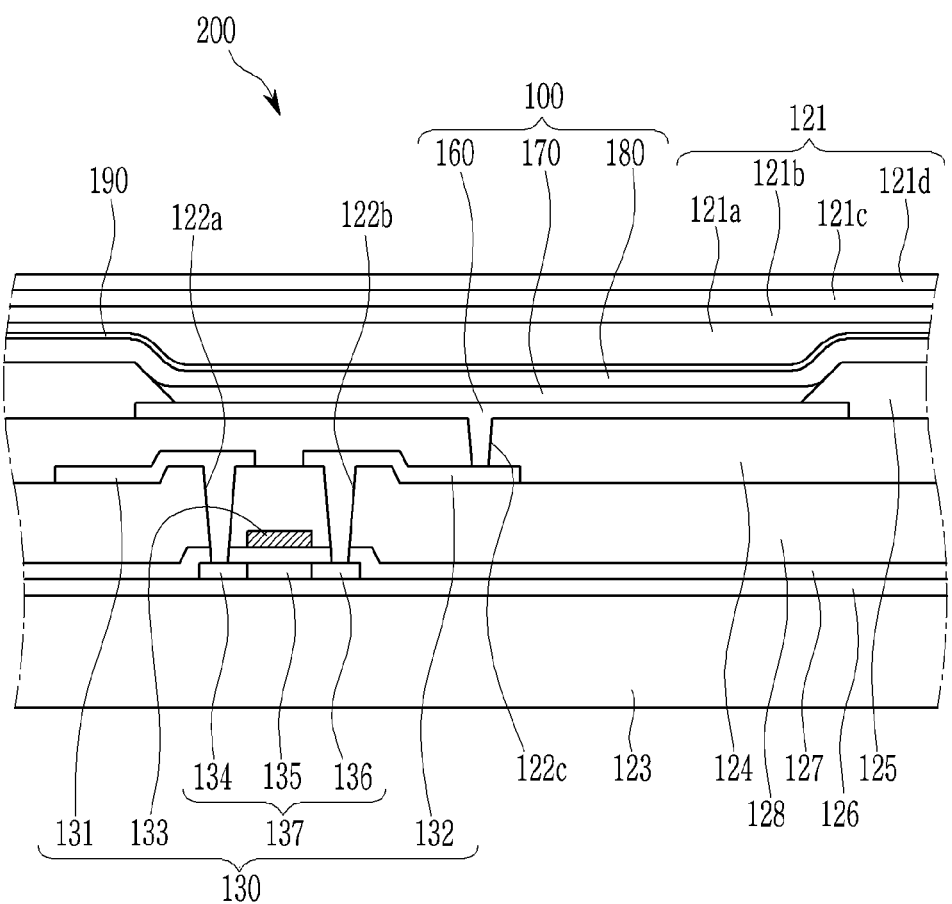
FIG. 5 is a cross-sectional view of an embodiment of a display device.

Although the structure of the display device shown in FIG. 5 includes a driving thin film transistor and a light emitting device, the structure of the display device may further include a switching thin film transistor, a signal line, and the like.

Referring to FIG. 4, the light emitting device according to an embodiment may have a structure in which a first electrode 160, a hole auxiliary layer 172, an emission layer 173, an electron auxiliary (e.g., transport) layer 174, and a second electrode 180 are sequentially stacked. A light emitting element layer 170 of FIG. 5, which will be described below, includes the hole auxiliary layer 172, the emission layer 173, and the electron transport layer 174.

When the first electrode 160 is an anode, the first electrode 160 may include a material having a relatively high work function for relatively easy hole injection.

The first electrode 160 according to an embodiment is a transparent electrode, and may be formed of a conductive oxide such as indium tin oxide (ITO), indium zinc oxide (IZO), zinc tin oxide (ZTO), copper indium oxide (ClO), copper zinc oxide (CZO), gallium zinc oxide (GZO), aluminum zinc oxide (AZO), tin oxide ($SnO_2$), zinc oxide (ZnO), or a combination thereof; a metal such as calcium (Ca), ytterbium (Yb), aluminum (Al), silver (Ag), magnesium (Mg), or a combination thereof; a conductive carbon such as graphene or carbon nanotubes; a conductive polymer such as PEDOT:PSS, or a combination thereof; or a combination of at least two of the conductive oxide, the metal, the conductive carbon and the conductive polymer, for example, with a relatively small thickness.

The first electrode 160 is not limited thereto and may have a structure in which two or more layers are present.

The hole auxiliary layer 172 may be provided between the first electrode 160 and the emission layer 173. In this case, the hole auxiliary layer 172 may be a hole injection layer facilitating the injection of the hole from the first electrode 160 to the emissive layer 173, a hole transport layer facilitating the transport of the holes, or a combination thereof.

In addition, the hole auxiliary layer 172 may include an electron blocking layer that blocks the move of the electron.

The hole injection layer, the hole transport layer, or a combination thereof may include for example poly(3,4-ethylenedioxythiophene):poly(styrenesulfonate (PEDOT:PSS), poly(9,9-dioctyl-fluorene-co-N-(4-butylphenyl)-diphenylamine) (TFB), polyarylamine, poly(N-vinylcarbazole) (PVK), polyaniline, polypyrrole, N,N,N',N'-tetrakis(4-methoxyphenyl)-benzidine (TPD), 4, 4'-bis[N-(1-naphthyl)-N-phenyl-amino]biphenyl (α-NPD), m-MTDATA (4,4',4"-Tris[phenyl(m-tolyl)amino]triphenylamine), 4,4',4"-tris(N-carbazolyl)-triphenylamine (TCTA), 1,1-bis[(di-4-toylamino)phenylcyclohexane (TAPC), or a combination thereof, but is not limited thereto.

The hole blocking layer may include, for example, at least one of 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, or a combination thereof, but is not limited thereto.

In FIG. 4, the hole auxiliary layer 172 is formed as a single layer, but it is not limited thereto and may include a plurality of layers including at least two stacked layers.

Without wishing to be bound by any theory, it is believed that the light emitting film of an embodiment is adopted as the emissive layer (173) in the device of an embodiment to improve the hole injection, thereby providing improved balance between the electrons and the holes as recombined, and accordingly, a light emitting device 100 of an embodiment may exhibit enhanced stability and luminous properties.

The emissive layer 173 may be disposed on the hole auxiliary layer 172. The emissive layer 173 includes the quantum dots of the foregoing embodiments. For example, the emissive layer 173 may represent a basic color such as blue, green, or red or a combined color thereof. The emissive layer may be formed by preparing a dispersion including the quantum dots dispersed in a solvent, applying the dispersion via a spin coating, an ink jet coating, a spray coating, or a combination thereof, and drying the same. The emissive layer may have a thickness of greater than or equal to about 5 nm, for example, from about 10 nm to about 100 nm, for example, from about 10 nm to about 50 nm or about 15 nm to about 30 nm.

An electron auxiliary layer 174 may be disposed on the emissive layer 173. The electron auxiliary layer 174 may be disposed between the emissive layer 173 and the second electrode 180. The electron auxiliary layer 174 may be an electron injection layer facilitating the injection of the electrons from the second electrode to the emissive layer 173, an electron transport layer facilitating the transport of the electrons, or a combination thereof.

The electron auxiliary layer 174 may include a hole blocking layer that blocks the holes.

The electron transport, the injection layer, or a combination thereof may include, for example, at least one of 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, or a combination thereof, but is not limited thereto.

In FIG. 4, the electron auxiliary layer 174 is formed as a single layer, but it is not limited thereto and may include a plurality of layers including at least two stacked layers.

The second electrode 180 is disposed on the electron auxiliary layer 174. In the light emitting device of an embodiment, the first electrode 160 may be an anode, and the second electrode 180 may be a cathode, but it is not limited thereto. The first electrode 160 may be a cathode, and the second electrode 180 may be an anode.

The second electrode 180 may be a transparent electrode. The second electrode 180 may be formed of a conductive oxide such as indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide ($SnO_2$), zinc oxide (ZnO), or a combination thereof, a metal such as calcium (Ca), ytterbium (Yb), aluminum (Al), silver (Ag), magnesium (Mg), or a combination thereof, a conductive carbon such as graphene or carbon nanotubes, a conductive polymer such as PEDOT:PSS, with a relatively small thickness, or a combination thereof.

Hereafter, in an embodiment, a display device including the foregoing light emitting device will be described with reference to FIG. 5.

Referring to FIG. 5, a buffer layer 126 may be provided on a substrate 123. The buffer layer 126 may prevent permeation of an impurity, and may flatten the surface of the substrate 123.

A semiconductor layer 137 may be provided on the buffer layer 126. The semiconductor layer 137 may be formed with a polycrystalline silicon.

The semiconductor layer 137 may include a channel region 135 that is not doped with an impurity, a source region 134, and a drain region 136. The source region 134 and the drain region 136 are disposed at opposite sides of the channel region 135, and each of the source region 134 and the drain region 136 may be doped, respectively. Here, the doped ion impurity may vary with the type of a thin film transistor.

A gate insulating layer 127 may be provided on the semiconductor layer 137, and a gate wire including a gate electrode 133 may be provided on the gate insulating layer 127. In this case, the gate electrode 133 may be disposed to overlap at least a part of the semiconductor layer 137, particularly, the channel region 135.

An interlayer insulating layer 128 may be provided on the gate insulating layer 127 and the gate electrode 133. A first contact hole 122a and a second contact hole 122b that overlap the source region 134 and the drain region 136 of the semiconductor layer 137 may be provided in the gate insulating layer 127 and the interlayer insulating layer 128.

Data wires including a source electrode 131 and a drain electrode 132 may be provided on the interlayer insulating layer 128.

The source electrode 131 and the drain electrode 132 are respectively electrically connected with the source region 134 and the drain region 136 of the semiconductor layer 137 through the first contact hole 122a and the second contact hole 122b respectively provided in the interlayer insulating layer 128 and the gate insulating layer 127.

The aforementioned semiconductor layer 137, the gate electrode 133, the source electrode 131, and the drain electrode 132 may constitute a thin film transistor 130, but the configuration of the thin film transistor 130 is not limited to the aforementioned example, and may be variously modified by those skilled in the art.

Next, a planarization layer 124 may be provided on the interlayer insulating layer 128 and the data wire. The planarization layer 124 may remove, planarize, or a combination thereof a step, e.g., a height difference between the insulating layer 128 and the source electrode 131, the drain electrode 132 included in the data wire, or a combination thereof, in order to increase emission efficiency of the light emitting element to be provided thereon.

The planarization layer 124 may have a third contact hole 122c overlapping the drain electrode 132.

An embodiment is not limited to the aforementioned structure, and in some cases, one of the planarization layer 124 and the interlayer insulating layer 128 may be omitted.

Next, a first electrode 160 included in a light emitting device 100 may be provided on the planarization layer 124. The first electrode 160 may be a pixel electrode. The first electrode 160 may be connected with the drain electrode 132 through the third contact hole 122c of the planarization layer 124.

A pixel defining layer 125 having an opening overlapping the first electrode 160 may be provided on the planarization layer 124. The light emitting element layer 170 may be provided for each opening that is included in the pixel defining layer 125. That is, a pixel area in which each light emitting element layer 170 is formed by the pixel defining layer 125 may be defined.

The light emitting element layer 170 may be provided on the first electrode 160. As described with reference to FIG. 5, the light emitting element layer 170 may include the hole auxiliary layer 172, the emission layer 173, and the electron auxiliary layer 174, the configuration of the light emitting element layer 170 may be the same as that described above, and the description thereof will be omitted below.

The second electrode 180 may be provided on the light emitting element layer 170. The second electrode 180 may be a common electrode. The first electrode 160, the light emitting element layer 170, and the second electrode 180 may constitute the light emitting device 100.

The first electrode 160 and the second electrode 180 may be made of a transparent conductive material or a transflective or reflective conductive material. Depending on the types of the materials that form the first electrode 160 and the second electrode 180, the display device 200 may be a top emission type, a bottom emission type, or a double-sided emission type.

An overcoat 190 protecting the second electrode 180 may be provided on the second electrode 180.

A thin film encapsulation layer 121 may be provided on the overcoat 190. The thin film encapsulation layer 121 may encapsulate and protect the light emitting device and a circuit part (not shown) provided on the substrate 123 from the external environment.

The thin film encapsulation layer 121 may include organic encapsulation layers 121a and 121c and inorganic encapsulation layers 121b and 121d which are alternately laminated. In FIG. 5, for example, a case where two organic encapsulation layers 121a and 121c and two inorganic encapsulation layers 121b and 121d are alternately laminated to configure the thin film encapsulation layer 121 is illustrated, but it is not limited thereto, and the structure of the thin film encapsulation layer 121 can be variously modified as desired.

Hereinafter, the embodiments are illustrated in more detail with reference to examples. However, the present disclosure is not limited thereto.

EXAMPLES

Analysis Method
1 Photoluminescence Analysis

A Hitachi F-7000 spectrometer is used to perform a photoluminescence spectrum analysis with irradiation light of 458 nanometers (nm) (532 nm for red quantum dots (QD)). The photoluminescence spectrum of the quantum dots is obtained.

2. Time Resolved Spectroscopic Analysis

Time Resolved Spectroscopic Analysis is performed by using a fluorescence lifetime spectrometer made by Picoquant.

3. Fourier-Transform Infrared (FT-IR) Spectroscopy Analysis

A FT-IR analysis is made using Vertex70-Hyperion3000.

4. Electroluminescence Analysis

An electroluminescent spectrum is obtained by using a current-voltage (IV) tester 2635B manufactured by Keithley Co., Ltd. and CS-2000A of Konica Minolta Co., Ltd.

5. X-ray Photoelectron Spectroscopy (XPS) Analysis

Quantum 2000 made by Physical Electronics, Inc. is used to perform an XPS element analysis under a condition of an acceleration voltage: 0.5-15 kiloelectron volts (keV), 300 watts (W), and a minimum analysis area: 200×200 micrometers squared ($\mu m^2$).

Preparation of Quantum Dots

Reference Example 1

1. Preparation of ZnTeSe Based Core

A 2 molar (M) Se/TOP stock solution containing selenium in trioctylphosphine (TOP) and a 2M Te/TOP stock solution containing tellurium in TOP are prepared. In a 400 milliliter (mL) reaction flask, a trioctylamine solution including 0.125 millimoles (mmol) of zinc acetate and 0.25 mmol of palmitic acid is prepared and then heated under a vacuum at 120° C. After one hour, an atmosphere in the reactor is replaced with nitrogen.

After being heated at 300° C., the prepared Se/TOP stock solution and the prepared Te/TOP stock solution are rapidly injected and the reaction proceeds for one hour. After the reaction, the resulting solution is then cooled to room temperature and acetone is added thereto to make a precipitation, which is then separated by centrifugation and dispersed in toluene.

2. Preparation of ZnTeSe Core/ZnSeS Shell 0.9 mmol of zinc acetate, 1.8 mmol of oleic acid (OA), and 10 mL of trioctylamine are placed in a flask, subjected to a vacuum state at 120° C. for 10 minutes, and then heated to 280° C. after the atmosphere in the flask is exchanged with $N_2$. Then, a toluene dispersion of the ZnTeSe core prepared above (OD=optical density of $1^{st}$ excitonic absorption, OD=0.45) is quickly injected and then 0.6 mmol Se/TOP and 0.2 mmol S/TOP are added to the flask, and then the reaction proceeds for 120 minutes. After the completion of the reaction, the reaction solution is quickly cooled to room temperature and ethanol is added thereto to make a precipitation, which is then centrifuged to obtain quantum dots, and the quantum dots are redispersed in toluene or chloroform. The prepared ZnSe/ZnSeS quantum dots have a PL peak wavelength of about 450 nm and a quantum yield of about 60%.

Preparation of Light Emitting Film

Comparative Example 1

0.2 ml of a blue quantum dot (BQD) dispersion obtained in Reference Example 1 is spin-coated on a substrate. The obtained film is heat-treated at a temperature of 80° C. for 30 minutes to obtain a light emitting film.

Example 1-1

An ethanol solution of zinc chloride (concentration: 10 milligrams per milliliter (mg/mL)) is placed dropwise on a film obtained in the same manner as in Comparative Example 1 and the reaction proceeds for one minute to obtain a $ZnCl_2$-treated film. The $ZnCl_2$ treated film is washed with ethanol five times. The washed film is heat-treated at a temperature of 80° C. for 30 minutes to obtain a light emitting film.

Example 1-2

A light emitting film is obtained in the same manner as Example 1-1 except that an ethanol (EtOH) solution of zinc chloride (concentration: 100 mg/mL) is used.

Experimental Example 1: Infrared Spectroscopy Analysis

Figure 6:
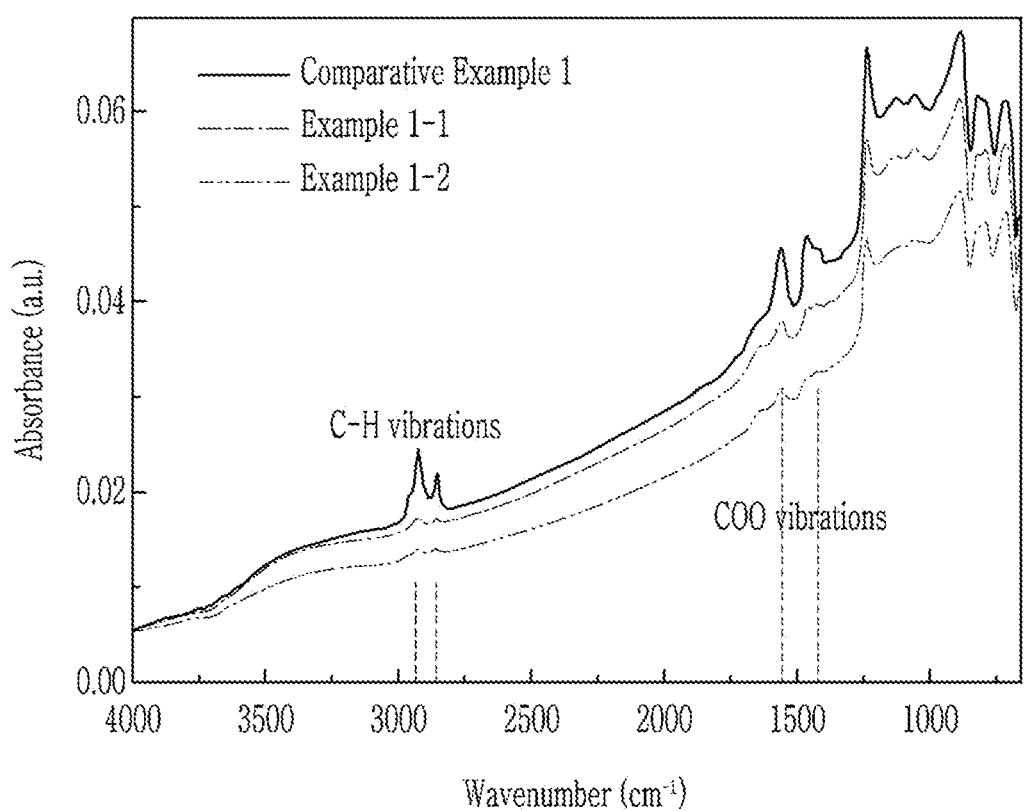
FIG. 6 is a graph of absorbance (arbitrary units, a.u.) versus wavenumber (inverse centimeters, $cm^{-1}$) and shows a result of Fourier transform infrared spectroscopy (FT-IR)

An infrared (IR) spectroscopic analysis is made for each of the light emitting films obtained in Comparative Example 1, Example 1-1, and Example 1-2, respectively and the results are shown in FIG. 6 and Table 1.

TABLE 1

| Wavenumber (inverse centimeters, $cm^{-1}$) | Comparative Example 1 OA-QD | Example 1-1 $ZnCl_2$/EtOH = 10 mg/ml | Example 1-2 $ZnCl_2$/EtOH = 100 mg/ml |
|---|---|---|---|
| OA peak at 2852 Relative intensity (%) | 100 | 12.9 | 11.3 |
| OA peak at 1556 Relative intensity (%) | 100 | 38.8 | 26.4 |

The results of FIG. 6 and Table 1 confirm that the light emitting films of Example 1-1 and Example 1-2 exhibit significantly decreased intensities of the peaks that are assigned to the oleic acid (C—H vibrations at 2,922 $cm^{-1}$ and 2,852 $cm^{-1}$ and $COO^-$ vibrations at 1,545 $cm^{-1}$ and 1,403 $cm^{-1}$).

Experimental Example 2: XPS Analysis

An XPS analysis is made for each of the light emitting films obtained in Comparative Example 1, Example 1-1, and Example 1-2, respectively and the results are shown in Table 2.

TABLE 2

| | C1s | N1s | O1s | Si2p | S2p | Cl2p | Zn2p3 | Se3d | Te3d5 |
|---|---|---|---|---|---|---|---|---|---|
| Comp. Ex 1 OA-QD | 55.92 | 0 | 8.22 | 0.8 | 9.33 | — | 20.88 | 4.53 | 0.01 |
| Example 1-1 $ZnCl_2$/EtOH = 10 mg/ml | 38.58 | 0 | 9.2 | 1.47 | 11.06 | 0.65 | 33.04 | 5.99 | 0 |
| Example 1-2 $ZnCl_2$/EtOH = 100 mg/ml | 38.57 | 0.2 | 7.52 | 3 | 11.2 | 0.97 | 32.29 | 6.23 | 0.01 |

The results of Table 2 confirm that the chlorine is detected in the light emitting films of Example 1-1 and Example 1-2. The mole ratio of the carbon with respect to zinc is significantly decreased in the light emitting films of Example 1-1 and Example 1-2. In comparison to the light emitting film of Comparative Example 1, substantial oxidation of the quantum dot does not occur in the light emitting films of Example 1-1 and Example 1-2.

Experimental Example 3: Photoluminescent (PL) Characterization and Time-Resolved PL Characterization of the Light Emitting Film A photoluminescent (PL) analysis and a time-resolved PL analysis are made for each of the light emitting films obtained in Comparative Example 1, Example 1-1, and Example 1-2, respectively and some of the results are shown in Table 3 and FIG. 7.

The results of table 3 confirm that the light emitting films of Example 1-1 and Example 1-2 may have enhanced photoluminescent properties in comparison with the light emitting film of Comparative Example 1.

TABLE 3

| | PL peak wavelength of the light emitting film (nm) | Quantum Yield (QY) of the light emitting film (%) |
|---|---|---|
| Comp. Ex 1 | 458 | 60 |
| Ex 1-1 | 459 | 76 |
| Ex 1-2 | 459 | 82 |

The results of FIG. 7 confirm that the light emitting films of Example 1-1 and Example 1-2 exhibit increased decay constant, which indicates trap passivation by the zinc chloride.

Preparation of Electroluminescent Device

Comparative Example 2

An indium tin oxide (ITO) electrode (cathode) is vapor deposited on a substrate and a poly(3,4-ethylenedioxythiophene):poly(styrenesulfonate (PEDOT:PSS) layer and a poly(9,9-dioctyl-fluorene-co-N-(4-butylphenyl)-diphenylamine) (TFB) layer (or a poly(N-vinylcarbazole) (PVK) layer) are formed as a hole injection layer and a hole transport layer thereon via a wet chemical process, respectively.

On the hole transport layer, a light emitting film having a thickness of 15 nm is formed in the same manner as Comparative Example 1.

On the light emitting film, an ET204 (8-(4-(4,6-di(naphthalen-2-yl)-1,3,5-triazin-2-yl)phenyl)quinolone):Liq (8-hydroxy-quinolinolate) layer and a Liq layer are formed via vapor deposition. A silver (Ag) electrode is vapor-deposited on the electron auxiliary layer.

Example 2

An ITO electrode (cathode) is vapor deposited on a substrate and a PEDOT:PSS layer and a TFB layer (or a PVK layer) are formed as a hole injection layer and a hole transport layer thereon via a wet chemical process, respectively.

On the hole transport layer, a light emitting film having a thickness of 15 nm is formed in the same manner as Example 1-2.

On the light emitting film, an ET204:Liq layer and a Liq layer are formed via vapor deposition. A silver (Ag) electrode is vapor-deposited on the electron auxiliary layer.

Example 3

An ITO electrode (cathode) is vapor deposited on a substrate and a PEDOT:PSS layer and a TFB layer (or a PVK layer) are formed as a hole injection layer and a hole transport layer thereon via a wet chemical process, respectively.

On the hole transport layer, a light emitting film having a thickness of 15 nm is formed in the same manner as Example 1-2 except for using a mixture of ethanol and methanol (MeOH) as a solvent for the zinc chloride.

On the light emitting film, an ET204:Liq layer and a Liq layer are formed via vapor deposition. A silver (Ag) electrode is vapor-deposited on the electron auxiliary layer.

Example 4

An ITO electrode (cathode) is vapor deposited on a substrate and a PEDOT:PSS layer and a TFB layer (or a PVK layer) are formed as a hole injection layer and a hole transport layer thereon via a wet chemical process, respectively.

On the hole transport layer, a light emitting film having a thickness of 15 nm is formed in the same manner as Example 1-2 except for using isopropanol (IPA) as a solvent for the zinc chloride.

On the light emitting film, an ET204:Liq layer and a Liq layer are formed via vapor deposition. A silver (Ag) electrode is vapor-deposited on the electron auxiliary layer.

Comparative Example 3

An ITO electrode (cathode) is vapor deposited on a substrate and a PEDOT:PSS layer and a TFB layer (or a PVK layer) are formed as a hole injection layer and a hole transport layer thereon via a wet chemical process, respectively.

On the hole transport layer, a light emitting film having a thickness of 15 nm is formed in the same manner as Example 1-2 except for using an ethanol solution of tetrabutylammonium chloride (TBACl) instead of the zinc chloride.

On the light emitting film, an ET204:Liq layer and a Liq layer are formed via vapor deposition. A silver (Ag) electrode is vapor-deposited on the electron auxiliary layer.

Experimental Example 4: Evaluation of Electroluminescent Properties and Life Time of the Device A voltage of 0 to 7 volts (V) is applied to each of the light emitting devices of Examples 2 to 4 and Comparative Examples 2 to 3 to measure the maximum luminance of the device. The results are shown in Table 3.

With respect to the light emitting devices of Examples 2 to 4 and Comparative Examples 2 to 3, changes of the luminance over time are measured at a constant operating current density and a half life-time (T50) is obtained. The T50 is a time at which the luminance is halved with respect to the initial luminance. The results are shown in Table 4 and FIG. 8.

TABLE 4

| | Maximum Luminance (candelas per square meter, $Cd/m^2$) | T 50 (hour) |
| --- | --- | --- |
| Comparative Example 2 OA-QD reference | 3000 | 0.60 |
| Example 2 $ZnCl_2$ EtOH | 4300 | 3.38 |
| Example 3 $ZnCl_2$ EtOH + MeOH | 3600 | 3.36 |
| Example 4 $ZnCl_2$ IPA | 4200 | 2.75 |
| Comparative Example 3 TBACl | 1700 | 1.1 |

The results of Table 4 and FIG. 8 confirm that the device of the Examples exhibits higher luminance and improved life time in comparison with the Comparative Examples.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| Description of symbols | |
| --- | --- |
| 100: light emitting device | 123: substrate |
| 200: display device | 130: thin film transistor |
| 160: $1^{st}$ electrode | 172: hole auxiliary layer |
| 173: emissive layer | 174: electron auxiliary layer |
| 180: $2^{nd}$ electrode | |

What is claimed is:

1. A light emitting film comprising a plurality of quantum dots,
    wherein the plurality of quantum dots constitute at least a portion of a surface of the light emitting film,
    wherein the plurality of quantum dots do not comprise cadmium and lead, and
    wherein the plurality of quantum dots comprise a metal halide bound to a surface thereof.

2. The light emitting film of claim 1, wherein at least one quantum dot of the plurality of quantum dots comprises
    a core comprising a first semiconductor nanocrystal and
    a shell disposed on the core, the shell comprising a second semiconductor nanocrystal, wherein the second semiconductor nanocrystal has a composition different from the first semiconductor nanocrystal.

3. The light emitting film of claim 2, wherein
    the first semiconductor nanocrystal and the second semiconductor nanocrystal are independently a Group II-VI compound, a Group III-V compound, a Group IV-VI compound, a Group IV element or compound, a Group compound, a Group I-II-IV-VI compound, or a combination thereof.

4. The light emitting film of claim 1, wherein at least one quantum dot of the plurality of quantum dots comprises indium, zinc, or a combination thereof.

5. The light emitting film of claim 1, wherein at least one quantum dot of the plurality of quantum dots comprises InP, InZnP, ZnSe, ZnSeTe, or a combination thereof.

6. The light emitting film of claim 1, wherein an outermost layer of at least one quantum dot of the plurality of quantum dots comprises zinc and sulfur.

7. The light emitting film of claim 1, wherein the at least a portion of the surface of the light emitting film does not comprise an organic thiol compound.

8. The light emitting film of claim 1, wherein the plurality of the quantum dots comprises a carboxylic acid compound at a surface thereof.

9. The light emitting film of claim 8, wherein the carboxylic acid compound comprises a C6 to C30 carboxylic acid compound.

10. The light emitting film of claim 1, wherein the metal halide comprises zinc, indium, magnesium, lithium, or a combination thereof.

11. The light emitting film of claim 1, wherein the metal halide comprises a zinc chloride, a zinc bromide, a zinc iodide, an indium chloride, an indium bromide, an indium iodide, a gallium chloride, a gallium bromide, a gallium iodide, a magnesium chloride, a magnesium bromide, a magnesium iodide, a lithium chloride, a lithium bromide, a lithium iodide, or a combination thereof.

12. The light emitting film of claim 1, wherein a thickness of the light emitting film is greater than or equal to about 15 nanometers.

13. A method of producing the light emitting film of claim 1, which comprises:
   disposing on a substrate a film comprising the plurality of quantum dots; and
   treating the film with a solution comprising the metal halide in a first polar solvent to bind the metal halide to at least one quantum dot of the plurality of quantum dots.

14. The method of claim 13, further comprising
   washing the treated film with a second polar solvent that does not comprise a metal halide, and
   heating the washed film to a temperature of greater than or equal to about 60° C.

15. The method of claim 13, wherein the first polar solvent comprises a C1 to C10 alcohol.

16. A light emitting device, which comprises:
   a first electrode and a second electrode facing each other, and
   the light emitting film of claim 1 disposed between the first electrode and the second electrode.

17. The light emitting device of claim 16, further comprising between the first electrode and the light emitting layer, a hole auxiliary layer comprising a hole injection layer, a hole transport layer, or a combination thereof.

18. The light emitting device of claim 16, further comprising an electron auxiliary layer comprising an electron injection layer, an electron transport layer, or a combination thereof between the second electrode and the light emitting layer.

19. A display device comprising the light emitting device of claim 16.

20. The light emitting film of claim 1, wherein:
   the plurality of quantum dots comprise ZnTeSe, ZnSeS, or a combination thereof; and
   the metal halide comprises a zinc chloride.

* * * * *